United States Patent [19]
DiMarzio et al.

[11] Patent Number: 5,389,792
[45] Date of Patent: Feb. 14, 1995

[54] ELECTRON MICROPROBE UTILIZING THERMAL DETECTOR ARRAYS

[75] Inventors: Don DiMarzio, Northport; Larry Lesyna, Plainview, both of N.Y.

[73] Assignee: Grumman Aerospace Corporation, Bethpage, N.Y.

[21] Appl. No.: 126

[22] Filed: Jan. 4, 1993

[51] Int. Cl.$^6$ .................. G01T 1/36; H01L 31/115; H01L 31/0296
[52] U.S. Cl. .............. 250/370.06; 250/336.2; 250/370.01; 250/370.15
[58] Field of Search ............. 250/370.06, 370.15, 250/336.2, 338.4, 370.09, 370.01

[56] References Cited
PUBLICATIONS

B. T. Draine and A. J. Sievers, "A High Responsivity, Low-Noise Germanium Bolometer for the Far Infrared." *Optics Communications*, vol. 16, No. 3 (Mar. 1976) pp. 425–428.

Margaret Osvay, V. Stenger and G. Földiák, "Silicon Detectors for Measurement of High Exposure Rate Gamma Rays." *Proceedings of the Symposium on Advances in Biomedical Dosimetry*, Vienna, Austria (Mar. 10–14, 1975) pp. 623–632.

*Primary Examiner*—Constantine Hannaher
*Attorney, Agent, or Firm*—Pollock, Vande Sande & Priddy

[57] ABSTRACT

An electron beam from a scanning electron microscope, or X-rays from an external X-ray source, impinges on a material sample surface thereby causing the generation of fluorescent X-rays characteristic of the elements present in the sample. An improved energy dispersive X-ray detector system for materials analysis, based on a monolithically fabricated thermal detector array and solid state refrigeration system, is described. The detector array converts the X-ray photons to heat, and the heat is measured as a rise in temperature by thermistors in the individual detector elements in the array. The small detector elements in the array are kept at a low temperature so as to achieve an energy resolution of less than 5 eV, and the multiple elements in the array insure that a sufficient X-ray count rate for normal materials analysis is achieved. The signals from the individual thermal detectors in the array are then processed so that a distribution of X-ray counts as a function of energy is produced, and the characteristic X-ray fluorescent lines of the individual elements in the sample can be identified. Accordingly, the composition of the sample may be determined.

2 Claims, 2 Drawing Sheets

ELECTRON MICROPROBE UTILIZING THERMAL DETECTOR ARRAYS

FIELD OF THE INVENTION

The present invention relates to high resolution energy dispersive spectrometers for use in electron microprobe systems commonly found in scanning electron microscopes and X-ray fluorescence systems.

BACKGROUND OF THE INVENTION

Scanning electron microscopes often have the capability to perform electron microprobe measurements on various materials. This involves the use of energy dispersive spectrometry (EDS) to measure the energy and intensity of characteristic X-ray fluorescence lines emitted from various elements in a sample, as a result of being probed and excited by an electron beam. The elemental composition can then be determined as a function of location on the sample. Present EDS systems offer limited energy resolution, which limits its ability to measure compositions accurately, as well as detecting trace elements. Wavelength dispersive spectrometers (WDS) offer good energy resolution but data collection is very time intensive. The present invention, a monolithically fabricated X-ray thermal (bolometer, calorimeter) array combined with a means of cooling to cryogenic temperatures, offers significantly improved performance and is presented as a replacement for conventional detection systems.

An X-ray thermal detector is comprised of two parts placed in good thermal contact; an X-ray absorbing material, and a thermometer material. An X-ray photon is absorbed in the X-ray absorbing layer, creating electron-hole pairs in this material. These electron-hole pairs recombine and convert their energy to heat. The heat, which is proportional to the energy of the original photon, is conducted through the absorbing material to the thermometer. The thermometer's temperature is raised in response to this induced heat, and its resistance or other electronic properties is changed. These changes are detected electronically and amplified and filtered to produce a peak voltage. The peak voltage corresponds to one X-ray photon count; the magnitude of the peak voltage is a measure of the photon energy. After many photons are counted, their numbers as a function of energy are registered in a multichannel analyzer, and a plot of photon count versus photon energy is generated. Peaks in this energy distribution plot correspond to characteristic X-ray fluorescence lines of various elements present in the material emitting these X-rays. The intensity of the lines (peaks) is a measure of the relative amounts of the elements present.

An advantage of thermal detectors is the extremely high energy resolution obtainable when cooled to low temperatures, typically near 0.1K, in order to reduce the total heat capacity of the detector. Conventional solid state detectors (lithium-drifted silicon detectors) have energy resolutions around 160 eV, while the natural line width of characteristic fluorescence line is of the order of a few eV. For multi-element samples, the 160 eV broadening of the fluorescence lines may result in line overlap. This results in reduced sample compositional accuracy, and small peaks from elements of low concentration may be obscured entirely. Another disadvantage of poor energy resolution is high trace element detection limits. Conventional solid state detectors have a broad energy window which leads to a high background count rate and obscures the weak fluorescence line being measured. The thermal detector, on the other hand, can have an energy resolution on the order of a few eV, so peak overlap is greatly reduced, and the reduced background from its narrow energy window significantly lowers the minimum concentration of trace material that can be detected.

BRIEF DESCRIPTION OF THE PRESENT INVENTION

The present invention may be realized by combining three advanced technologies to produce a high energy resolution X-ray detection system that can be used not only in electron microprobe systems, but also in X-ray fluorescence (XRF) systems that use X-rays rather than electrons as the exciting probe. The three technologies are: 1) low temperature direct deposition of a polycrystal HgTe X-ray absorbing layer on the thermistor wafer, 2) indium bump bonds for array fabrication, and 3) adiabatic demagnetization refrigerator to achieve a temperature of 0.1K.

Our basic X-ray detector starts with a layer of X-ray absorbing HgTe bonded to an ion-implanted silicon thermistor wafer. A thin silicon wafer is first ion implanted with phosphorous and boron on one side to make an electrically active and temperature sensitive layer (thermistor). This ion-implanted wafer is then introduced to a molecular beam epitaxy (MBE) system, where polycrystalline HgTe is directly deposited on the side of the silicon wafer opposite to the ion-implanted side. Because HgTe is highly absorbing of X-rays and very efficient in thermalizing the electron-hole pairs generated by X-ray absorption, only a thin layer is needed. The advantage of using MBE is the relatively low temperature used in HgTe deposition, which will minimize any alteration to the silicon thermistor wafer.

After HgTe deposition, the water is then removed from the MBE system; and the ion-implanted side of the wafer is connected to readout circuitry using an array of indium bump bonds. These bump bonds serve as a mechanical support for the wafer, an electrical connection from the thermistor to the readout, and a weak thermal link between the readout circuitry and the detector. Because indium undergoes a superconducting transition, its thermal conduction at operating temperatures (0.1K) is low.

The HgTe/thermistor wafer is then lithographically or laser etched to produce an array of separate detector elements supported by their individual sets of indium bump bonds. An array of small detectors is needed for two reasons: to minimize the heat capacity of each element in order to maximize their energy resolution and to provide a large surface area so that a sufficient number of X-ray photons per second can be detected.

The detector array is then placed in a solid state adiabatic demagnetization refrigerator (ADR) where the temperature is brought to 0.1K. At this temperature the full-width-half-maximum (resolution) of a detected fluorescence line will be on the order of 5 eV. This is compared to the resolution of 160 eV previously stated for conventional detection systems.

BRIEF DESCRIPTION OF THE FIGURES

The above-mentioned objects and advantages of the present invention will be more clearly understood when considered in conjunction with the accompanying drawings, in which.

DETAILED DESCRIPTION OF THE INVENTION

Figure 1:
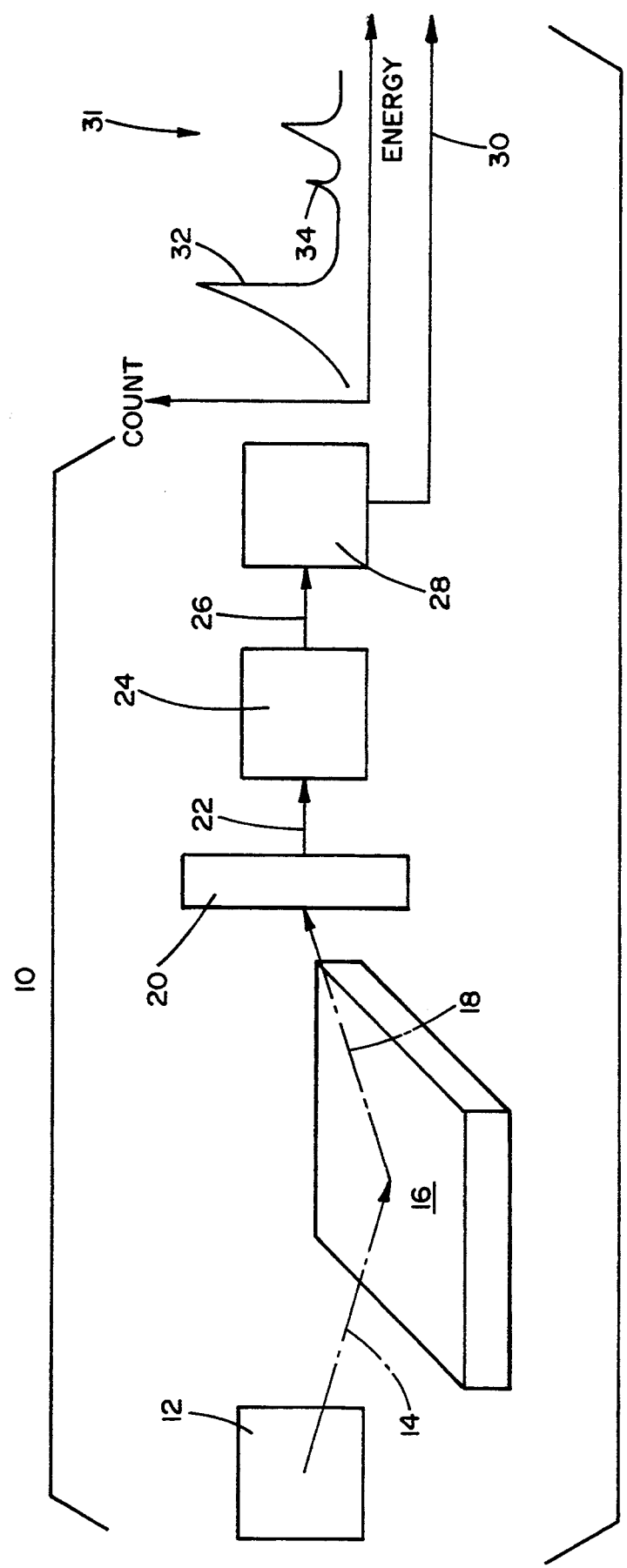
FIG. 1 is a block diagram of a prior art electron microprobe.

FIG. 1 schematically illustrates a prior art electron microprobe system 10 wherein a scanning electron microscope 12 emits an electron beam 14 which impinges upon a material sample 16. The electrons excite atomic core levels of atoms in the sample, when then relax by emitting fluorescent X-rays characteristic of the particular atom (element). The fluorescent X-rays of various energies indicated by reference numeral 18 fall incident onto an energy dispersive X-ray detector (EDS) 20. The output 22 from the detector is input to the converter 24 which amplifies, filters, and produces a peak voltage proportional to the X-ray energy. The converted electrical signals are input to a multi-channel analyzer 28 at input 26. The analyzer generates a population or count distribution of detected X-rays as indicated in plot 31. The various peaks such as 32, 34 of the distribution plot 31 correspond to the characteristic fluorescent lines of the elements in the sample 16 when subjected to electron excitation. The distribution plot 31 therefore informs us as to which elements are present in the sample and in what percentage of composition.

The improvements of the present invention begin with replacement of the conventional low resolution EDS detector with an improved version of a thermal detector. Thermal detectors with small heat capacity operating at low temperatures have been demonstrated to have an energy resolution below 20 eV as disclosed in D. McCammon, S. H. Moseley, J. C. Mather, "Experimental Tests of a Single Photon Calorimeter for X-ray Astronomy," *J. Appl. Phys.*, 56, pp 1263–1266 (1984). Further improvements in performance have been achieved using a bulk piece of HgTe epoxied to an ion-implanted silicon thermistor. HgTe is a good choice because its high atomic number atoms absorb X-rays easily, and its semi-metal behavior means it has little electronic contribution to its heat capacity at low temperatures. Our improvement here is to deposit a thin film of polycrystal HgTe directly onto the silicon thermistor wafer (side opposite to the ion-implanted thermistor layer) at low temperatures (190° C. or less) using a molecular beam epitaxy system (MBE). Other direct deposition techniques such as metal-organic chemical vapor deposition (MOCVD) require higher deposition temperatures (400° C.) and may affect the thermistor electrical characteristics as well as other device structures patterned on the wafer.

Figure 2:
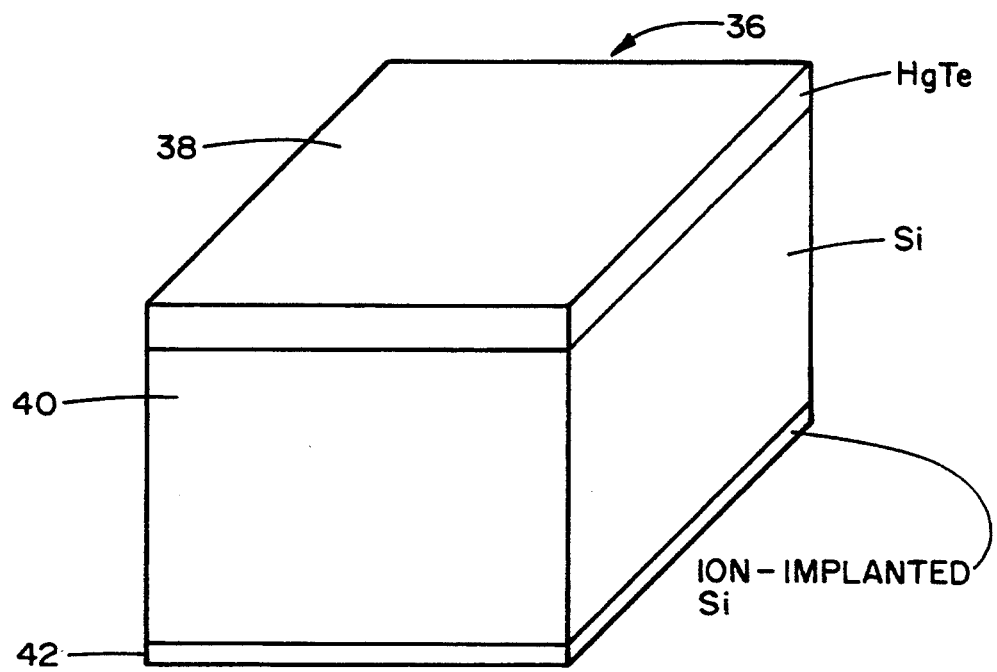
FIG. 2 is a diagrammatic view of a monolithic multilayer detector element.

FIG. 2 shows the three-layer structure of the monolithic detector wafer 36. The HgTe layer 38 is 20 microns thick so as to absorb all of the X-rays in the 1 to 10 keV range which is typical for X-ray fluorescence emission. The total thickness of the middle silicon wafer 40 is about 300 microns (1 mil), and the bottom of the lower wafer 42 is implanted with phosphorous and boron to a thickness of 0.25 micron and serves as the thermistor. X-rays are absorbed in the HgTe layer 38, are converted to heat, and the heat is conducted by the silicon wafer 40 to the thermistor layer 42. The thermistor senses the temperature rise from the heat pulse and sends a signal to the readout electronics.

Figure 3:
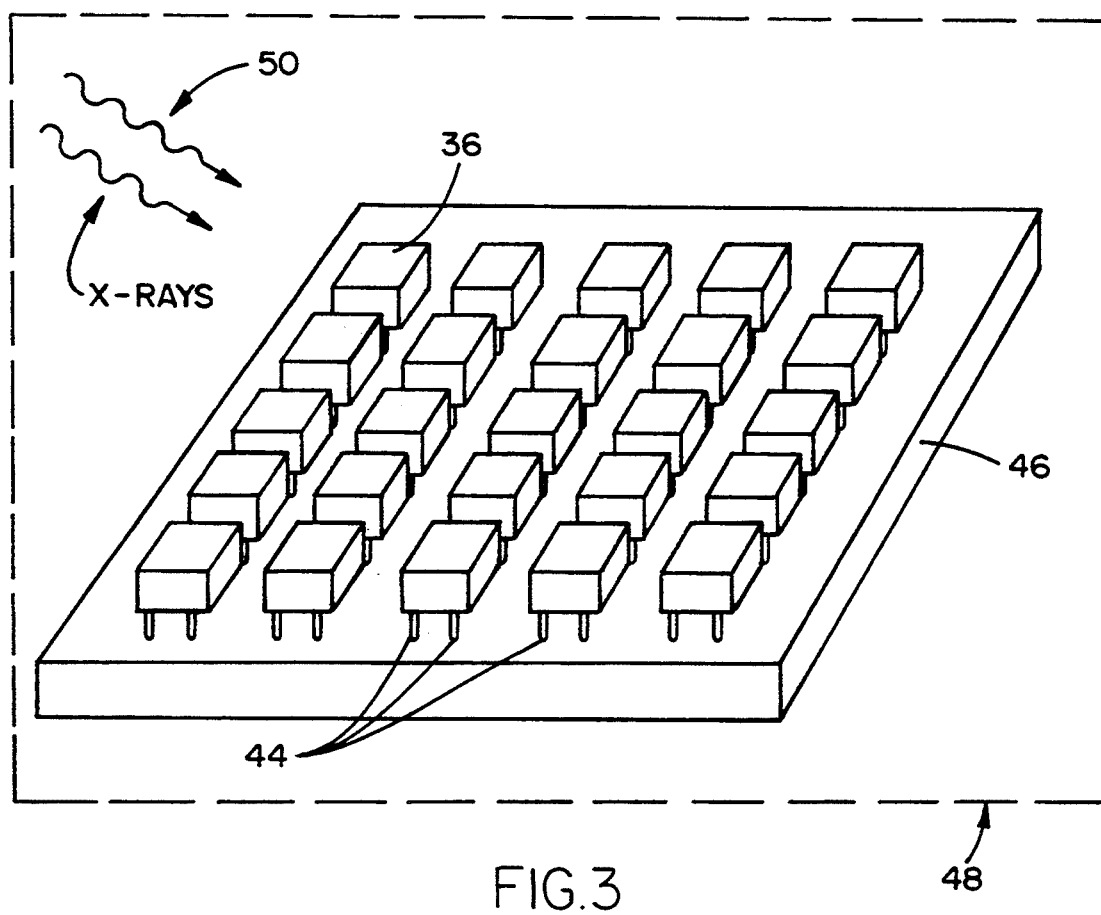
FIG. 3 is a diagrammatic view of a detector array bump bonded to readout, with ADR cryogenic environment.

The second innovation in our invention is shown in FIG. 3 wherein a 5×5 array of detector elements 36 are bump bonded to a readout wafer 46. This is fabricated as follows. The detector wafer shown in FIG. 2 is bump bonded to a readout wafer 46 with an array of pairs of small indium bumps 44. The indium bumps are drawn out in the bonding process to a thickness of about 3 microns. These bumps provide mechanical support, thermistor electrical connections, and a weak thermal link (superconducting at 0.1K). The bonded detector wafer is then lithographically or laser etched into 25 separate square detector elements 36, each with its own pair of indium bump bonds. The size of each element may be 0.2×0.2 mm in area. The small element size results in a low heat capacity and consequently good energy resolution. Multiple elements also increases the X-ray count rate, and the total surface area of the 25 detector elements (1 mm$^2$) is sufficient for anticipated SEM applications.

The third innovation is the use of a solid state adiabatic demagnetization refrigerator (ADR) to maintain the detector operating temperature of 0.1K. ADR has already been demonstrated for cooling thermal detectors to these temperatures, as disclosed in L. Lesyna, T. Roellig, M. Werner, and P. Kittel, "An Adiabatic Demagnetization Cooled Bolometer System," *Advances in Cryogenic Engineering*, Vol. 33, p. 955, Plenum, N.Y. 1988. FIG. 3 shows the array enclosed in an ADR cryogenic system 48, which can easily maintain an operating temperature of 0.1K for many hours. An X-ray window in the cryogenic enclosure allows X-rays 50 from the SEM electron beam excited sample to enter the detector. The output from the detector is then amplified, filtered, and sent to a multichannel analyzer to generate a distribution plot like the one shown at 31 in FIG. 1. It should be understood that any other type of atomic excitation that results in fluorescent X-rays can be used. For example, this detection system can be used in an X-ray fluorescence system for chemical analysis, where the atomic excitations are caused by an external X-ray beam rather than electrons.

The final result of these three innovations is an energy dispersive X-ray detection system that will have an energy resolution of less than 5 eV. This is to be compared to 160 eV for conventional systems. The thermal detector will greatly reduce fluorescent peak overlap and improve the accuracy of compositional determinations. It will also lower the minimum detectable level of many trace elements and impurities by at least an order of magnitude. Because of the low X-ray background already inherent in XRF systems, the use of such a thermal detector in an XRF system may lead to the first practical nondestructive method for measuring dopant levels and impurities in electronic semiconductor materials. If the resolution of the proposed thermal detector can approach the natural line width of the fluorescent peaks, it may be possible to measure the small shifts in energy position these peaks exhibit as the result of different chemical environments (oxides, etc.). This system will reveal not only the chemical composition with a high degree of accuracy, but the chemical state of the material as well. Such a system would be a boon for material science and materials manufacturing.

It should be understood that the invention is not limited to the exact details of construction shown and described herein for obvious modifications will occur to persons skilled in the art. For example:

1) HgTe may be replaced with other materials exhibiting good X-ray absorbance and low heat capacity.

2) In place of a thermistor, a thermometer which operates by a change of capacitance, inductance, or other electronic property as a function of temperature may be used.

3) The ADR may be replaced by a helium dilution refrigerator or other mechanism capable of cooling the detector to its operating temperature.

We claim:

1. An energy dispersive X-ray detector positioned in proximity to a material sample subjected to an atomically exciting probe, fluorescent X-rays emitted from the elements in the sample, the detector comprising:

a thin film layer of X-ray absorbent polycrystalline HgTe;

a water of electronic grade silicon to which the X-ray absorbent layer is bonded, an interface of the wafer, bonded to the absorbent material, being free of ion implantation;

an outward layer of the silicon wafer, opposite the interface, having preselected amounts of phosphorous and boron implanted therein thereby serving as a thermistor layer;

bump bond contacts extending from spaced points of the thermistor layer to allow electrical and thermal feedthrough to a connected readout wafer;

a cryogenic system to keep the detector at a temperature below the superconducting transition temperature of indium;

wherein the X-ray absorbent layer converts impinging X-rays to heat which passes through the wafer to the thermistor layer tier the corresponding changes of electrical impedance thereof.

2. The detector element set forth in claim 1 wherein the cryogenic system is a solid state adiabatic demagnetization refrigerator (ADR) that can maintain the detector at a temperature of 0.1K.

* * * * *